United States Patent
Nakayama et al.

(10) Patent No.: US 7,608,479 B2
(45) Date of Patent: Oct. 27, 2009

(54) METHOD OF MANUFACTURING SEMICONDUCTOR DEVICE AND METHOD OF TREATING ELECTRICAL CONNECTION SECTION

(75) Inventors: Hirohisa Nakayama, Sakata (JP); Shiro Sato, Tsuruoka (JP); Masanobu Shoji, Tsuruoka (JP); Hitoshi Nosaka, Tsuruoka (JP)

(73) Assignee: Seiko Epson Corporation, Tokyo (JP)

( * ) Notice: Subject to any disclaimer, the term of this patent is extended or adjusted under 35 U.S.C. 154(b) by 233 days.

(21) Appl. No.: 11/332,262

(22) Filed: Jan. 17, 2006

(65) Prior Publication Data

US 2006/0160347 A1 Jul. 20, 2006

(30) Foreign Application Priority Data

Jan. 19, 2005 (JP) ............................. 2005-011763

(51) Int. Cl.
*H01L 21/00* (2006.01)
(52) U.S. Cl. ............................. 438/106; 257/E23.069
(58) Field of Classification Search ......... 438/106–108, 438/15; 257/E23.069
See application file for complete search history.

(56) References Cited

U.S. PATENT DOCUMENTS

| 4,714,517 | A | 12/1987 | Malladi et al. |
| 5,127,968 | A | 7/1992 | Gomi et al. |
| 5,215,601 | A | 6/1993 | Gomi et al. |
| 5,458,907 | A | 10/1995 | Ishido |
| 5,482,174 | A | 1/1996 | Namiki et al. |
| 5,643,831 | A | 7/1997 | Ochiai et al. |
| 6,025,258 | A | 2/2000 | Ochiai et al. |
| 6,271,110 | B1 | 8/2001 | Yamaguchi et al. |
| 6,319,810 | B1 | 11/2001 | Ochiai et al. |
| 6,358,847 | B1 | 3/2002 | Li et al. |
| 6,395,454 | B1 | 5/2002 | Piscevic |
| 6,528,346 | B2 | 3/2003 | Ochiai et al. |
| 6,713,880 | B2* | 3/2004 | Sahara et al. ............... 257/783 |
| 6,720,204 | B2 | 4/2004 | Sudijono et al. |
| 6,818,988 | B2* | 11/2004 | Gosselin et al. ............. 257/737 |
| 6,872,650 | B2 | 3/2005 | Anzai |
| 2002/0058417 | A1 | 5/2002 | Li et al. |
| 2002/0127825 | A1 | 9/2002 | Mui et al. |
| 2002/0180029 | A1* | 12/2002 | Higashitani et al. ......... 257/700 |
| 2003/0119295 | A1* | 6/2003 | Chang et al. ................ 438/612 |
| 2003/0201309 | A1 | 10/2003 | Grigg et al. |
| 2004/0146659 | A1* | 7/2004 | Bednarz et al. ............. 427/475 |
| 2004/0222514 | A1* | 11/2004 | Crane et al. ................. 257/697 |

FOREIGN PATENT DOCUMENTS

| JP | A 3-81093 | 4/1991 |
| JP | A 9-270428 | 10/1997 |
| JP | A 2000-114313 | 4/2000 |
| JP | A 2001-156441 | 6/2001 |
| JP | A 2002-313990 | 10/2002 |

(Continued)

*Primary Examiner*—Thao X Le
*Assistant Examiner*—Elias Ullah
(74) *Attorney, Agent, or Firm*—Oliff & Berridge, PLC (57) ABSTRACT

A method of manufacturing a semiconductor device includes: applying a paste containing acid to an electrical connection section which is electrically connected with a semiconductor substrate; removing the paste from the electrical connection section by washing the electrical connection section; and providing a conductive material to the electrical connection section.

13 Claims, 9 Drawing Sheets

FOREIGN PATENT DOCUMENTS

| | | |
|---|---|---|
| JP | A 2003-258155 | 9/2003 |
| JP | A-2003-258416 | 9/2003 |
| JP | A 2004-104002 | 4/2004 |
| JP | A 2004-128290 | 4/2004 |
| JP | A 2004-207381 | 7/2004 |
| TW | 200305190 | 10/2003 |
| WO | WO 03/075340 A2 | 9/2003 |

* cited by examiner

METHOD OF MANUFACTURING SEMICONDUCTOR DEVICE AND METHOD OF TREATING ELECTRICAL CONNECTION SECTION

Japanese Patent Application No. 2005-11763, filed on Jan. 19, 2005, is hereby incorporated by reference in its entirety.

BACKGROUND OF THE INVENTION

The present invention relates to a method of manufacturing a semiconductor device and a method of treating an electrical connection section.

A solder ball is used as an external terminal of a semiconductor package such as a ball grid array (BGA) or a chip scale package (CSP). A solder ball is provided to an electrical connection section (land) of an interposer of a semiconductor package. An oxidation preventive film such as a plating film is generally formed on the surface of the land. This prevents oxidation of the surface of the land to improve reliability of the step of providing the solder ball. However, this method requires an additional step of treating the plating film. Moreover, when using nickel (Ni) as the material for the plating film, since a hard and fragile alloy layer is formed by soldering, the mechanical reliability of an external terminal may deteriorate. JP-A-2000-114313 discloses a related-art technology.

SUMMARY

A method of manufacturing a semiconductor device according to a first aspect of the invention comprises:

(a) applying a paste containing acid to an electrical connection section which is electrically connected with a semiconductor substrate;

(b) removing the paste from the electrical connection section by washing the electrical connection section; and (c) providing a conductive material to the electrical connection section.

A method of treating an electrical connection section according to a second aspect of the invention comprises:

(a) applying a paste containing acid to the electrical connection section; and (b) removing the paste from the electrical connection section by washing the electrical connection section before providing a conductive material to the electrical connection section.

DETAILED DESCRIPTION OF THE EMBODIMENT

The invention may provide a method of manufacturing a semiconductor device and a method of treating an electrical connection section which can improve reliability of an external terminal.

(1) A method of manufacturing a semiconductor device according to one embodiment of the invention includes:

(a) applying a paste containing acid to an electrical connection section which is electrically connected with a semiconductor substrate;

(b) removing the paste from the electrical connection section by washing the electrical connection section; and (c) providing a conductive material to the electrical connection section.

According to the embodiment of the invention, since an oxide film adhering to the surface of the electrical connection section can be removed by the acid contained in the paste, the reliability of the subsequent step of providing the conductive material is improved. Moreover, since the oxide film can be removed by the paste application step and the washing step, the manufacturing process is significantly simplified in comparison with the case of forming a plating film in advance.

(2) With this method of manufacturing a semiconductor device, the conductive material may include solder.

(3) With this method of manufacturing a semiconductor device, the step (c) may include providing the solder to the electrical connection section through a flux.

(4) With this method of manufacturing a semiconductor device, the paste applied in the step (a) may include a material the same as a material for the flux provided in the step (c).

This reduces the number of chemicals used in the manufacturing process.

(5) With this method of manufacturing a semiconductor device, the paste applied in the step (a) may include a material containing an acid at a ratio higher than that of a material for the flux provided in the step (c).

This enables the oxide film to be effectively removed from the surface of the electrical connection section.

(6) With this method of manufacturing a semiconductor device, the paste applied in the step (a) may include a material containing an acid having a higher reducing power than that of an acid contained in the flux provided in the step (c).

This enables the oxide film to be effectively removed from the surface of the electrical connection section.

(7) With this method of manufacturing a semiconductor device, the step (a) and the step (b) may be performed in air or in an oxygen atmosphere.

Therefore, even if a gaseous substance adheres to the surface of the electrical connection section during the application step, since the gaseous substance forms an oxide film, the oxide film can be removed by the washing step together with the paste. Therefore, the conductive surface of the electrical connection section can be reliably exposed.

(8) With this method of manufacturing a semiconductor device, the acid contained in the paste may be an organic acid.

(9) With this method of manufacturing a semiconductor device, the acid contained in the paste may be an inorganic acid.

(10) With this method of manufacturing a semiconductor device, the semiconductor substrate may be mounted on an interposer; and the electrical connection section may be a land formed on the interposer.

(11) With this method of manufacturing a semiconductor device, the electrical connection section may be an electrode pad formed on the semiconductor substrate.

(12) With this method of manufacturing a semiconductor device, a resin layer may be formed on the semiconductor substrate; and the electrical connection section may be a land formed on the resin layer.

(13) With this method of manufacturing a semiconductor device, the electrical connection sections may be arranged in rows and columns; and the step (a) and the step (b) may be carried out for the electrical connection sections positioned on an outer end of the rows and columns.

(14) With this method of manufacturing a semiconductor device, the step (a) and the step (b) may be carried out for the electrical connection sections positioned at outer corners of the rows and columns.

This is because stress tends to be applied to the corners of the rows and columns in which the electrical connection sections are arranged.

(15) With this method of manufacturing a semiconductor device, the electrical connection sections may be arranged in rows and columns in an area enclosing a specific area; and the step (a) and the step (b) may be carried out for the electrical connection sections positioned on an inner end of the rows and columns closest to the specific area.

This prevents deterioration of the mechanical reliability due to a plating film. Therefore, it is effective to apply this measure to electrical connection sections to which stress tends to be applied.

(16) A method of treating an electrical connection section according to another, embodiment of the invention includes:

(a) applying a paste containing acid to the electrical connection section; and (b) removing the paste from the electrical connection section by washing the electrical connection section before providing a conductive material to the electrical connection section.

According to the embodiment of the invention, since an oxide film adhering to the surface of the electrical connection section can be removed by the acid contained in the paste, the reliability of the subsequent step of providing the conductive material is improved. Moreover, since the oxide film can be removed by the paste application step and the washing step, the manufacturing process is significantly simplified in comparison with the case of forming a plating film in advance.

(17) With this method of treating an electrical connection section, the step (a) and the step (b) may be performed in air or in an oxygen atmosphere.

Therefore, even if a gaseous substance adheres to the surface of the electrical connection section during the application step, since the gaseous substance forms an oxide film, the oxide film can be removed by the washing step together with the paste. Therefore, the conductive surface of the electrical connection section can be reliably exposed.

(18) With this method of treating an electrical connection section, the acid contained in the paste may be an organic acid.

(19) With this method of treating an electrical connection section, the acid contained in the paste may be an inorganic acid.

(20) With this method of treating an electrical connection section, the electrical connection section may be formed on a motherboard; and after the step (b), an electronic part may be soldered to the electrical connection section of the motherboard.

The embodiments of the invention are described below with reference to then drawings.

First Embodiment

FIGS. 1 to 4 are diagrams showing a method of manufacturing a semiconductor device according to a first embodiment to which the invention is applied. The method of manufacturing a semiconductor device includes a method of treating an electrical connection section.

Figure 1:
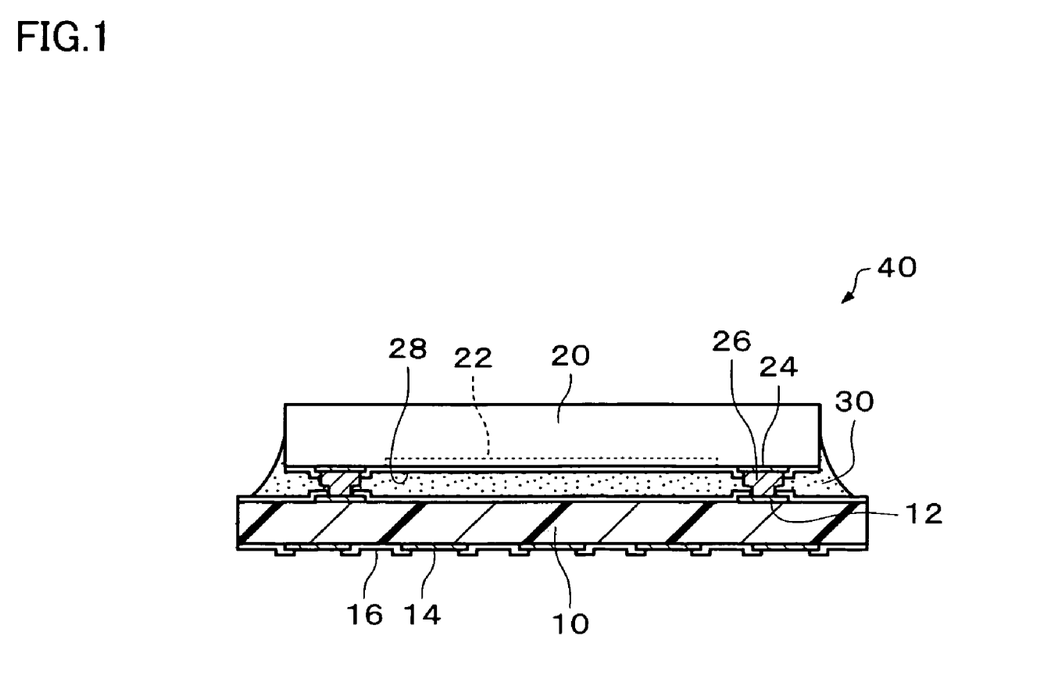
FIG. 1 is illustrative of a first embodiment of the invention.

In the first embodiment, an interposer 10 is provided. A semiconductor chip 20 (semiconductor substrate) is mounted on the interposer 10. Specifically, in the first embodiment, a semiconductor package 40 is provided by packaging the semiconductor chip 20.

The interposer 10 is an interconnect substrate on which the semiconductor chip 20 is mounted. The interposer 10 makes up the semiconductor package 40. The interposer 10 may be an organic resin substrate (e.g. epoxy substrate or polyimide substrate), an inorganic substrate (e.g. glass substrate or ceramic substrate), or an organic and inorganic composite substrate (e.g. glass epoxy substrate).

Electrical connection sections 12 and 14 are formed of a conductive material on either side of the interposer 10. The electrical connection sections 12 and 14 may be lands of an interconnect pattern, for example. The electrical connection sections 12 and 14 are formed of a metal (e.g. Cu). A protective film 16 (e.g. solder resist) is formed on the surface of the interposer 10. The protective film 16 protects the interconnect pattern in the area other than the electrical connection sections 12 and 14. For example, the protective film 16 is formed to avoid the center of the electrical connection section 14 (or electrical connection section 12) and to overlap the outer edge of the electrical connection section 14 (or electrical connection section 12).

The interposer 10 may be a single-layer substrate or a multi-layer substrate. In either case, the electrical connection sections 12 and 14 are electrically connected with each other. The electrical connection sections 12 and 14 may be electrically connected via a through-hole.

The semiconductor chip 20 includes an integrated circuit 22 and an electrode pad 24 (e.g. Al pad) electrically connected with the integrated circuit 22. The electrode pads 24 are generally positioned on the end (e.g. two or four opposite sides) of the semiconductor chip 20. A passivation film 28 is formed on the surface of the semiconductor chip 20 on the side of the electrode pad 24.

The semiconductor chip 20 is mounted on the surface of the interposer 10 on the side of the electrical connection section 12. The electrical connection section 14 is electrically connected with the semiconductor chip 20 through the electrical connection section 12. The semiconductor chip 20 may be mounted face-down so that the surface on which the electrode pad 24 is formed faces the interposer, or may be mounted face-up so that the surface on which the electrode pad 24 is formed faces the direction opposite to the interposer. When mounting the semiconductor chip 20 face-down, a bump (e.g. Au bump) is generally formed on the electrode pad 24. In this case, the semiconductor chip 20 (bump) and the interposer 10 (electrical connection section 12) may be electrically connected through an anisotropic conductive material 30. The anisotropic conductive material 30 may be either a film (ACF) or a paste (ACP). The anisotropic conductive material 30 includes a binder and conductive particles dispersed in the binder, and the bump and the electrical connection section 12 are electrically connected through the conductive particles provided therebetween. Or, the semiconductor chip 20 and the interposer 10 may be electrically connected by using a conductive resin paste or a metal junction (e.g. Au—Au junction, Au—Sn junction, or solder junction), or by utilizing the shrinkage force of an insulating resin. When using a metal junction, an underfill material (resin) may be provided between the semiconductor chip 20 and the interposer 10. When mounting the semiconductor chip 20 face-up, the semiconductor chip 20 and the interposer 10 are electrically connected by using a wire, and the entire semiconductor chip 20 is generally sealed with a resin.

In the first embodiment, an external terminal 60 is formed on the electrical connection section 14 of the interposer 10, as shown in FIGS. 2A to 4. The method of treating the electrical connection section is described below with reference to FIGS. 2A to 2C.

Figure 2A:
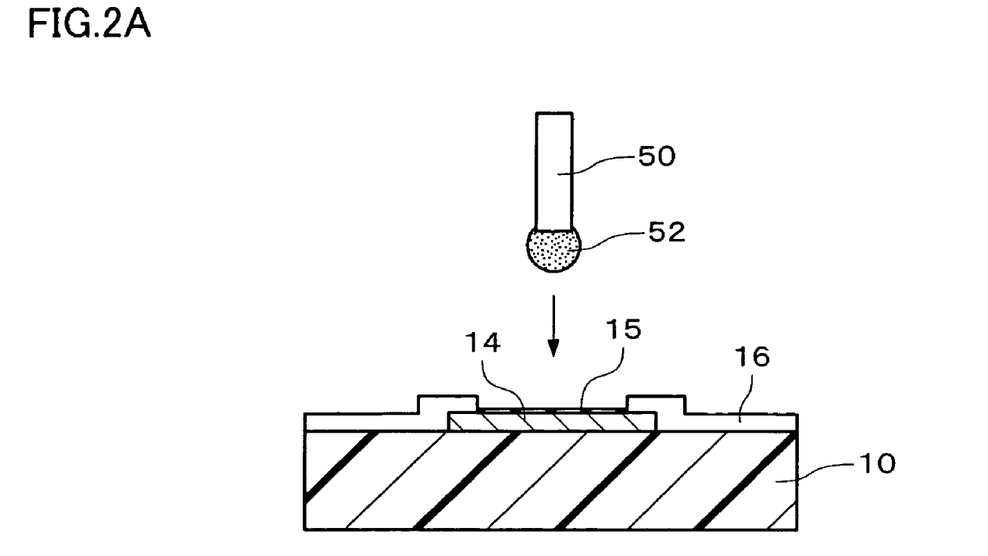
FIG. 2A to FIG. 2C are illustrative of the first embodiment of the invention.

As shown in FIG. 2A, an oxide film 15 adheres to the surface of the electrical connection section 14. The oxide film 15 is formed due to native oxidation, heating performed in the step of mounting the semiconductor chip 20, or heating performed in the step of drying the interposer 10, for example.

Figure 2B:
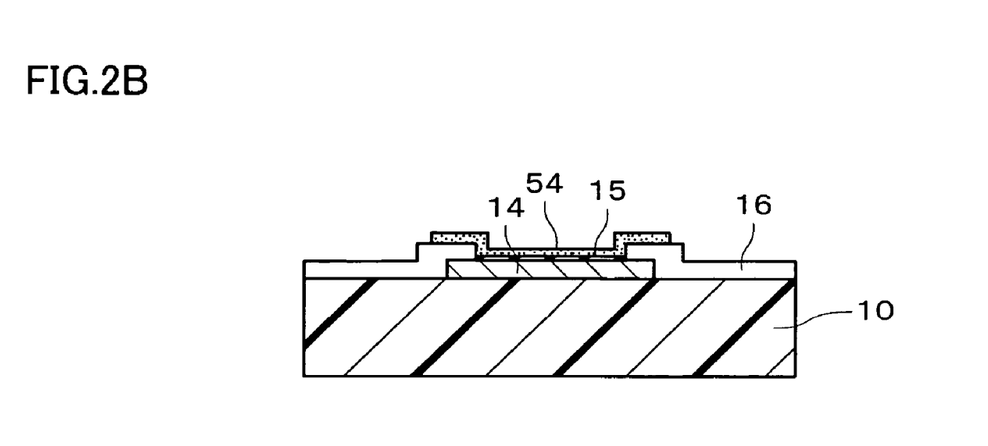

A paste 54 is applied to the electrical connection section 14 (see FIG. 2B). The paste 54 contains acid. The acid contained in the paste 54 may be either an inorganic acid or an organic acid. As the inorganic acid, a halogen acid aqueous solution may be used. As specific examples of the inorganic acid, hydrobromic acid (HBr), hydrochloric acid (HCl), sulfuric acid ($H_2SO_4$), nitric acid ($HNO_3$), phosphoric acid ($H_3PO_4$), and the like can be given. As a specific example of the organic acid, a carboxylic acid (RCOOH) can be given. Since the inorganic acid has a reducing power higher than that of the organic acid, the oxide film 15 can be effectively removed by using the paste 54 containing the inorganic acid. It is preferable to use hydrochloric acid or sulfuric acid since the hydrochloric acid or sulfuric acid has a reducing power higher than other inorganic acids (e.g. higher than hydrobromic acid).

The paste 54 may be flux. In this case, the paste 54 may contain a resin, an active agent, a solvent, and a thixotropic agent. As the resin, a water-soluble resin or a rosin-based resin may be used. The composition of the flux is not particularly limited insofar as the flux contains acid. For example, the flux may contain an aliphatic glycol ether, a modified hardened castor oil, glyceryl ether, an organic acid, an organic amine halogenated salt, and solder powder at a specific ratio.

The paste 54 may be formed of a material the same as the material for, a soldering flux 56 (see FIG. 3A) described later. This reduces the number of chemicals used in the manufacturing process. The paste 54 may be formed of a material containing acid at a ratio higher than that of the material for the soldering flux 56. The paste 54 may be formed of a material containing acid having a higher reducing power than that of the acid contained in the soldering flux 56. The above measure enables the oxide film 15 to be effectively removed from the surface of the electrical connection section 14.

The paste 54 may be applied by using a pin transfer method as shown in FIG. 2A, in which a droplet 52 is transferred by using a pin 50. As another method, a printing method (e.g. screen printing method), an inkjet method, an application method using a dispenser, or the like may be used. It suffices that the paste 54 be applied to the interposer 10 in the area including the electrical connection section 14. As shown in FIG. 2B, the paste 54 may be separately applied in units of electrical connection sections 14, for example.

After applying the paste 54 as shown in FIG. 2B, the paste 54 is allowed to stand for a specific period of time until a reduction reaction of a metal used as the material for the electrical connection section 14 is completed. For example, when using copper as the material for the electrical connection section 14 and applying the paste 54 containing hydrobromic acid to the electrical connection section 14, a chemical reaction shown by the following formula occurs.

$CuO$ (copper oxide)+$2HBr$ (hydrobromic acid)
→$CuBr_2$ (cupric bromide)+$H_2O$ (water)

The paste 54 may be heated in order to promote the chemical reaction. Or, the paste 54 may be allowed to stand at room temperature without heating in order to prevent volatilization of the acid contained in the paste 54. The chemical reaction reliably occurs by preventing volatilization of the acid.

Figure 2C:
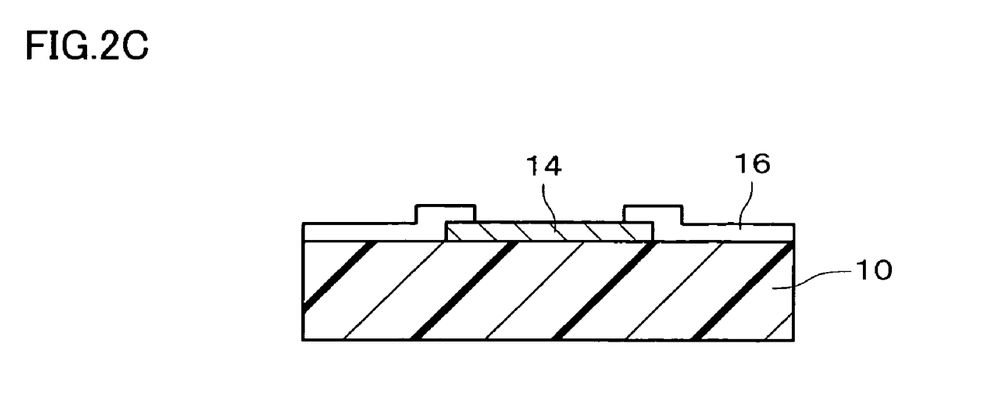

Then, the paste 54 is removed from the electrical connection section 14 by washing the electrical connection section 14, as shown in FIG. 2C. This allows the oxide film 15 adhering to the surface of the electrical connection section 14 to be removed together with the paste 54. Specifically, the conductive surface of the electrical connection section 14 can be reliably exposed.

The application step of the paste 54 and the washing step may be carried out in air or in an oxygen atmosphere. Therefore, even if a gaseous substance adheres to the surface of the electrical connection section 14 during the application step, since the gaseous substance forms an oxide film, the oxide film can be removed by the washing step together with the paste 54. This allows the conductive surface of the electrical connection section 14 to be reliably exposed. The application step of the paste 54 and the washing step may be carried out for all the electrical connection sections 14.

Figure 3A:
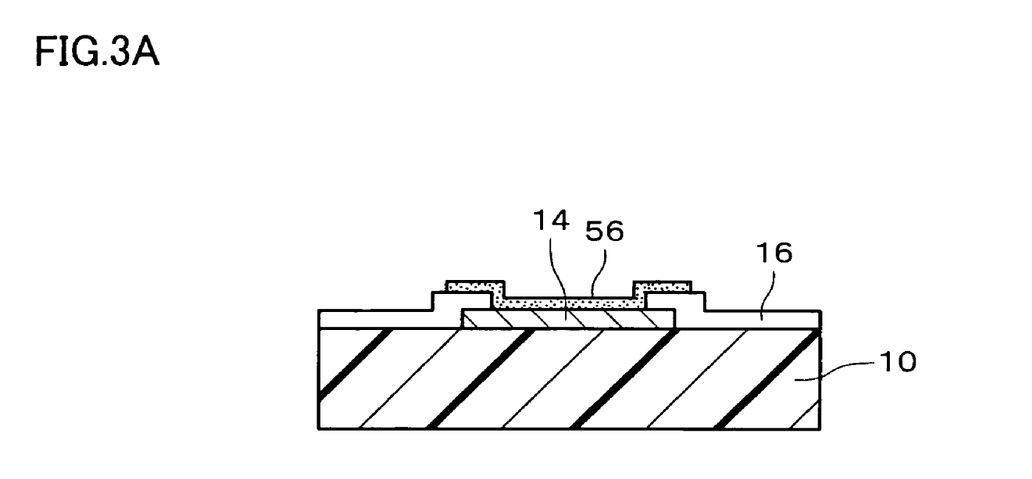
FIG. 3A and FIG. 3B are illustrative of the first embodiment of the invention.
Figure 3B:
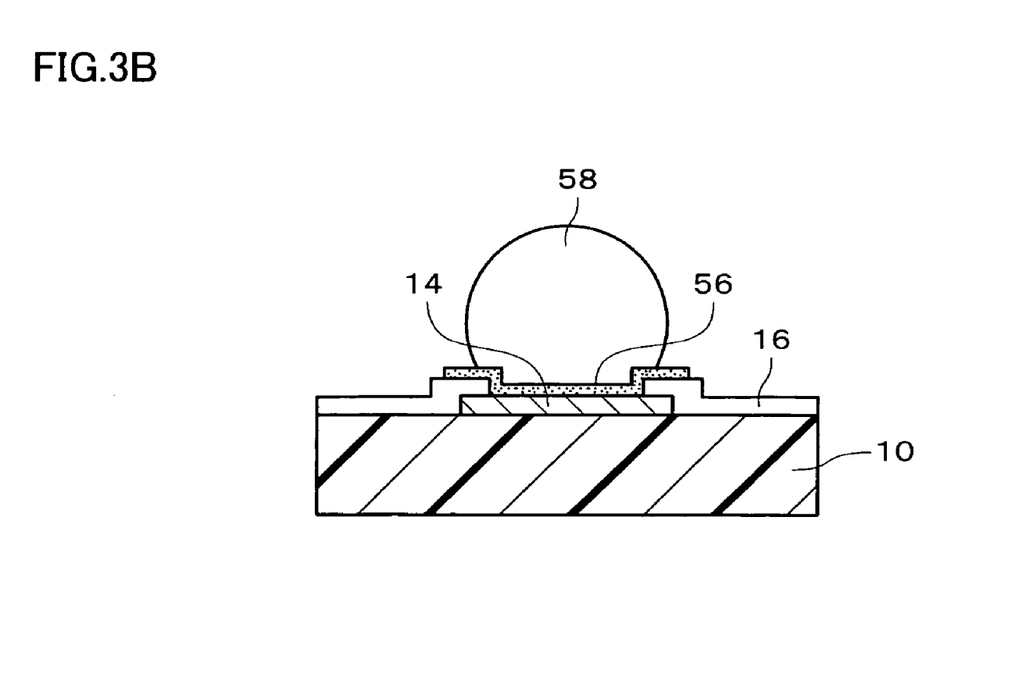

Then, a conductive material is provided on the electrical connection section 14. When using solder as the conductive material, solder 58 may be provided to the electrical connection section 14 through the flux 56. The solder 58 may be provided to the electrical connection section 14 as a solid solder ball. The soldering flux 56 is provided to improve the wettability of the solder 58 and to prevent oxidation of the surface of the external terminal 60 after completion of the product. The soldering flux 56 may be provided to the electrical connection section 14 before providing the solder 58. The solder 58 contains tin (Sn), for example.

Figure 4:
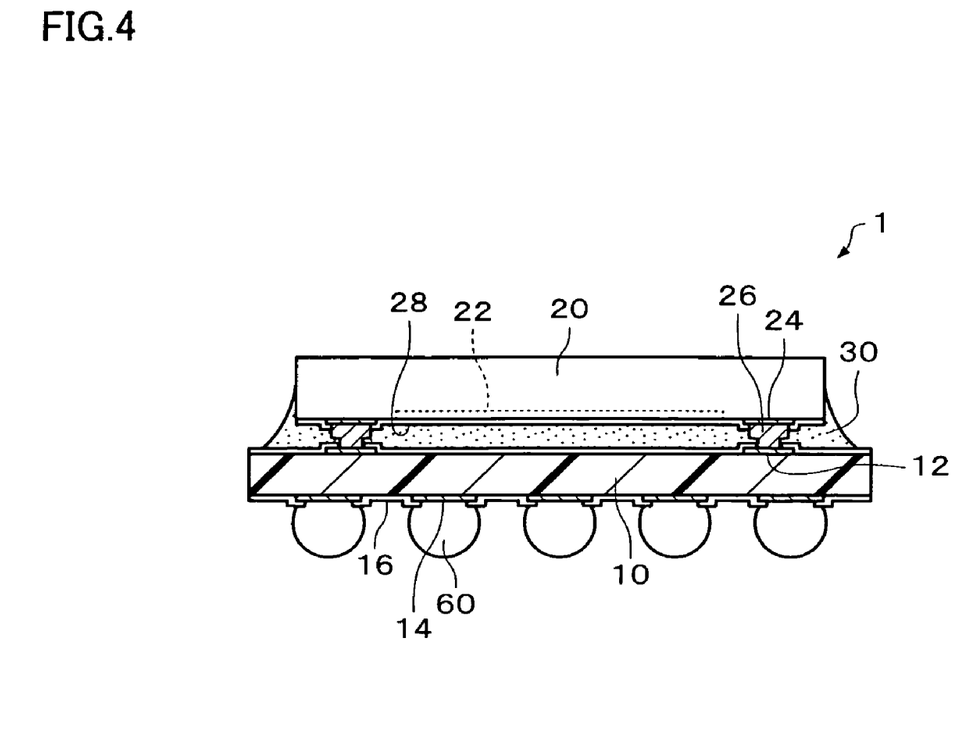
FIG. 4 is illustrative of the first embodiment of the invention.

Then, a reflow step is performed to form the external terminal 60 on the electrical connection section 14, as shown in FIG. 4. The flux 56 remaining on the external terminal 60 is removed by washing.

When performing the above-described steps for a set of interposers 10, the interposers 10 are separated by cutting. A semiconductor device 1 shown in FIG. 4 is manufactured in this manner.

According to the method of manufacturing a semiconductor device according to the first embodiment, since the oxide film 15 adhering to the surface of the electrical connection section 14 can be removed by utilizing the acid contained in the paste 54, the reliability of the subsequent step of providing the solder 58 is improved. Specifically, oxidation of the electrical connection section 14 is prevented without forming a plating film so that formation of a hard and fragile alloy layer due to a plating film is prevented, whereby deterioration of the mechanical reliability of the external terminal can be prevented. Moreover, the solder and the electrical connection section 14 can be reliably electrically connected by preventing oxidation of the surface of the electrical connection section 14. Furthermore, since the oxide film 15 can be removed by performing the application step of the paste 54 and the washing step, the manufacturing process is significantly simplified in comparison with the case of forming a plating film in advance.

Figure 5:
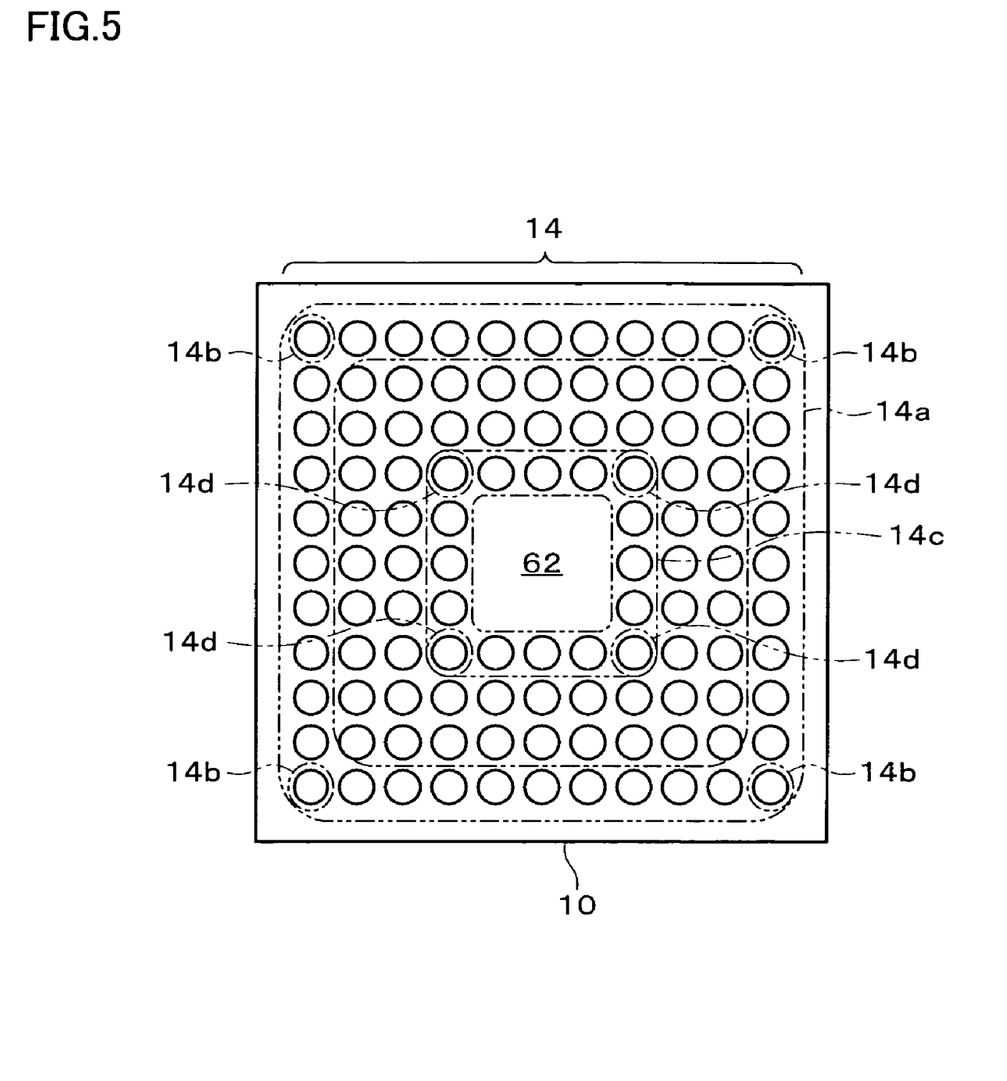
FIG. 5 is illustrative of a modification of the first embodiment of the invention.

A modification of the first embodiment is described below. FIG. 5 is a plan view of the interposer before the external terminal formation step. In this modification, the application step of the paste 54 and the washing step are carried out for a part of the electrical connection sections 14.

As shown in FIG. 5, the electrical connection sections 14 are arranged on the interposer 10 in rows and columns. For example, the electrical connection sections 14 may be arranged in a quadrilateral configuration. In this modification, the application step of the paste 54 and the washing step are carried out for the electrical connection sections 14 located at positions at which stress tends to be applied to the electrical connection sections 14. A plating film for preventing oxidation may be formed on the remaining electrical connection sections 14. This improves the mechanical strength of the area to which stress tends to be applied while ensuring the advantage of forming a plating film (e.g. improvement of temperature cycle reliability). The stress used herein includes stress applied due to expansion or shrinkage of the interposer 10 or the semiconductor chip 20.

For example, the application step of the paste 54 and the washing step may be carried out for (only) electrical connection sections 14a positioned on the outer end (including the outmost end) of the rows and columns, or may be carried out for (only) electrical connection sections 14b positioned at the outer corners of the rows and columns.

As shown in FIG. 5, when the electrical connection sections 14 are arranged in rows and columns in the area enclosing a specific area 62 (e.g. semiconductor chip mounting area), the application step of the paste 54 and the washing step may be carried out for (only) electrical connection sections 14c positioned on the inner end (including the innermost end) closest to the specific area 62, or may be carried out for (only) electrical connection sections 14d positioned at the outer corners of the specific area 62. The application step of the paste 54 and the washing step may be carried out for the electrical connection sections 14a (or electrical connection sections 14b) and the electrical connection sections 14c (or electrical connection sections 14d).

The semiconductor device used in this modification may be a fan-in type semiconductor device, a fan-out type semiconductor device, or a fan-in/out type semiconductor device. In a fan-in type semiconductor device, the electrical connection sections 14 are provided only inside of the mounting area of the semiconductor chip 20. In a fan-out type semiconductor device, the electrical connection sections 14 are provided only outside of the mounting area of the semiconductor chip 20. In a fan-in/out type semiconductor device, the electrical connection sections 14 are provided inside and outside of the mounting area of the semiconductor chip 20.

According to this modification, since deterioration of the mechanical reliability due to a plating film is prevented, it is effective to apply this modification to the electrical connection sections 14a to 14d to which stress tends to be applied.

Second Embodiment

Figure 6:
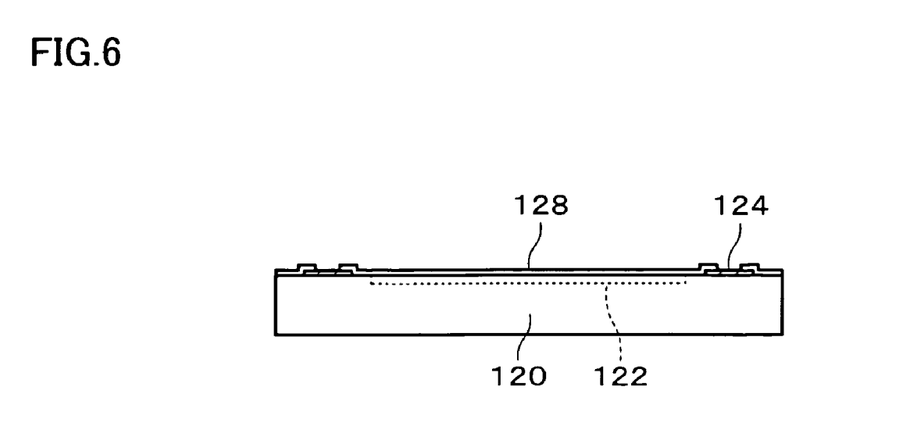
FIG. 6 is illustrative of a second embodiment of the invention.
Figure 7:
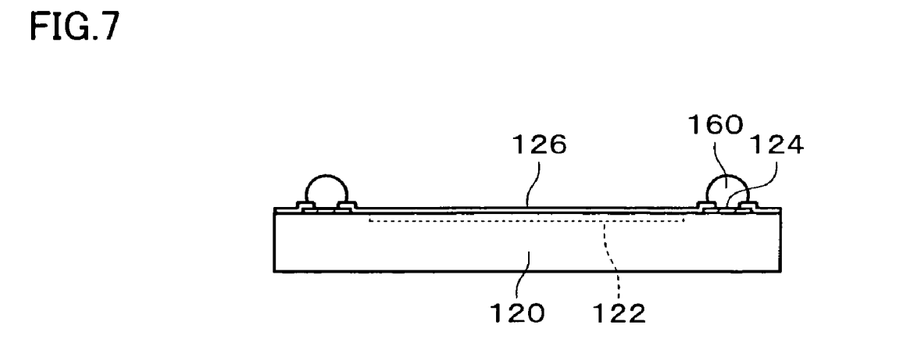
FIG. 7 is illustrative of the second embodiment of the invention.
Figure 8:
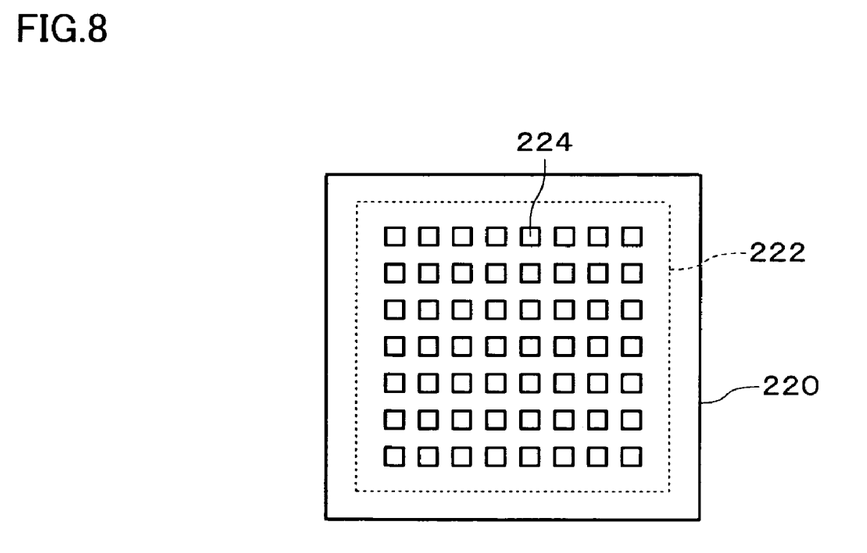
FIG. 8 is illustrative of a modification of the second embodiment of the invention.

FIGS. 6 to 8 are diagrams showing a method of manufacturing a semiconductor device according to a second embodiment of the invention.

In the second embodiment, a semiconductor substrate 120 is provided (see FIG. 6). The paste application step and the washing step described in the first embodiment are carried out for an electrode pad (electrical connection section) 124 of the semiconductor substrate 120 to form an external terminal 160 (see FIG. 7). The external terminal 160 may be formed of a conductive material such as solder or gold (Au), for example. When carrying out the above-described steps for a wafer, a semiconductor wafer is provided as the semiconductor substrate 120. The semiconductor wafer is cut after the formation step of the external terminal 160 in order to obtain individual semiconductor chips.

The semiconductor substrate 120 includes an integrated circuit 122 and the electrode pad (e.g. Al pad) 124 electrically connected with the integrated circuit 122. The electrode pads 124 are generally positioned on the end (e.g. two or four opposite sides) of each semiconductor chip of the semiconductor wafer. A passivation film 128 is formed on the surface of the semiconductor substrate 120 on the side of the electrode pad 124.

As a modification of the second embodiment, as shown in FIG. 8, a semiconductor substrate 220 in which electrode pads 224 are formed in the area including the area over an integrated circuit 222 may be provided, and the paste application step and the washing step may be carried out for the electrode pads 224 of the semiconductor substrate 220. The electrode pads 224 are arranged in rows and columns over the integrated circuit 222 (over the passivation film 126 in more detail).

According to this modification, since the electrode pads 224 are formed over the integrated circuit 222, a structure which can endure a larger amount of stress is required. However, such a requirement can be dealt with by applying this modification.

This modification may also be applied to the modification of the first embodiment. Specifically, the paste application step and the washing step may be carried out for only the electrode pads 224 disposed at positions at which stress tends to occur.

Third Embodiment

Figure 9:
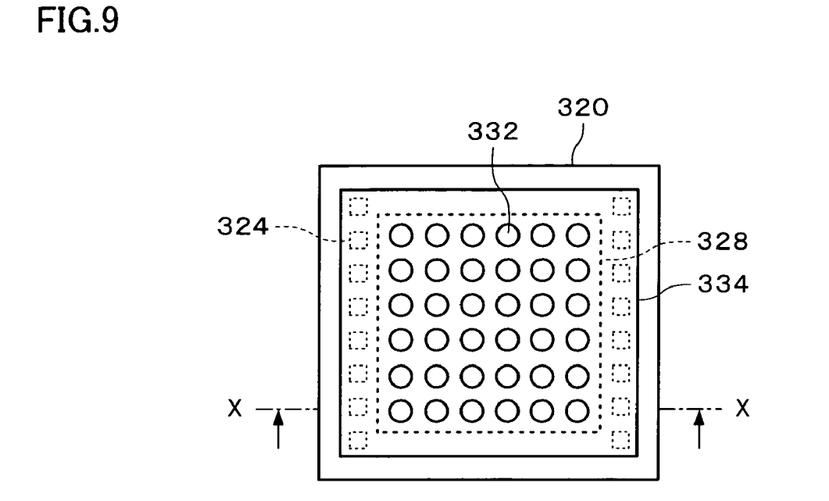
FIG. 9 is illustrative of a third embodiment of the invention.
Figure 10:
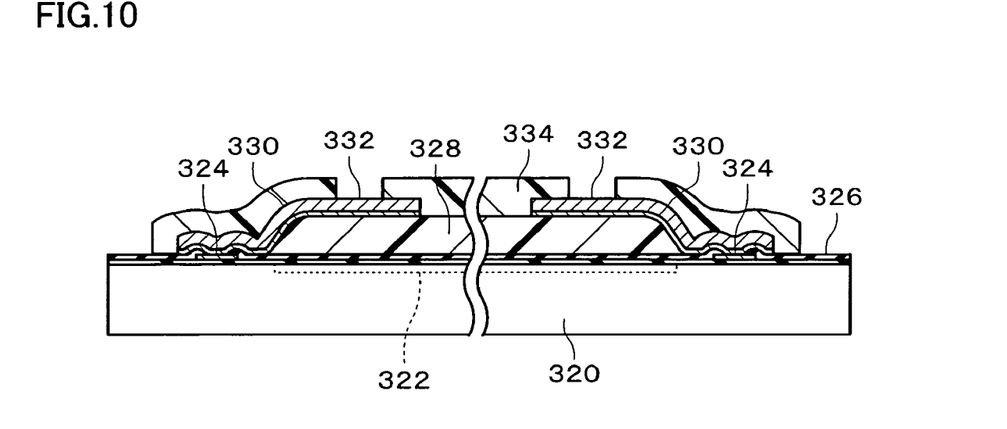
FIG. 10 is illustrative of the third embodiment of the invention.
Figure 11:
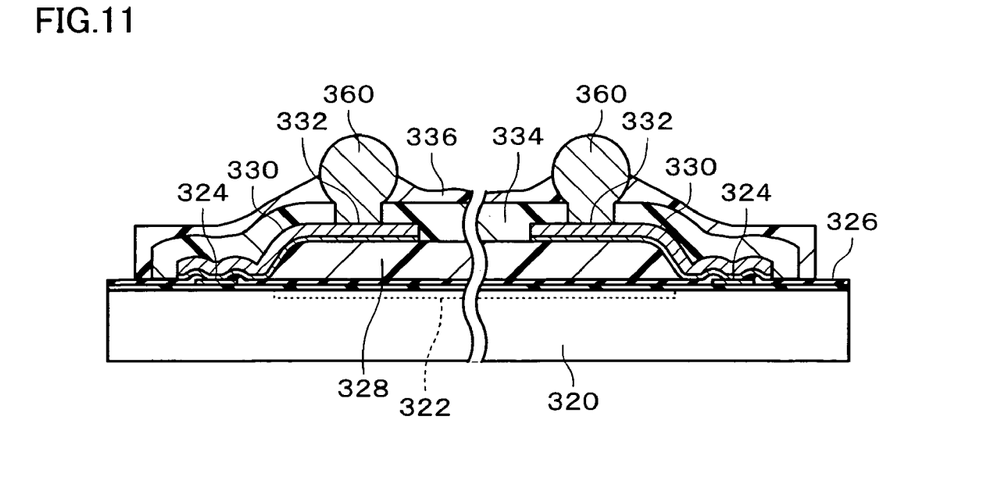
FIG. 11 is illustrative of the third embodiment of the invention.

FIGS. 9 to 11 are diagrams showing a method of manufacturing a semiconductor device according to a third embodiment of the invention. FIG. 10 is a cross-sectional view along the line X-X shown in FIG. 9.

In the third embodiment, a semiconductor substrate 320, in which a redistribution interconnect is formed at a wafer level, is provided (see FIG. 10). The paste application step and the washing step described in the first embodiment are carried out for an electrical connection section 332 (e.g. land) of the semiconductor substrate 320 to form an external terminal 360 (see FIG. 11). The external terminal 360 may be formed of a conductive material such as solder or gold (Au), for example. When carrying out the above-described steps for a wafer, a semiconductor wafer is provided as the semiconductor substrate 320. The semiconductor wafer is cut after the formation step of the external terminal 360 in order to obtain individual semiconductor chips.

The semiconductor substrate 320 includes an integrated circuit 322 and an electrode pad (e.g. Al pad) 324 electrically connected with the integrated circuit 322. The electrode pads 324 are generally positioned on the end (e.g. two or four opposite sides) of each semiconductor chip of the semiconductor wafer. A passivation film 326 is formed on the surface of the semiconductor substrate 320 on the side of the electrode pad 324.

A resin layer 328 is formed on the surface of the semiconductor substrate 320 on the side of the integrated circuit 322. The resin layer 328 is an underlayer of the electrical connection section 332 of an interconnect layer 330 described later. The resin layer 328 is formed inside the arrangement area of the electrode pads 324, for example. As examples of the material for the resin layer 328, a polyimide resin, a silicone-modified polyimide resin, an epoxy resin, a silicone-modified epoxy resin, benzocyclobutene (BCB), polybenzoxazole (PBO), and the like can be given.

The interconnect layer 330 electrically connected with the electrode pads 324 is formed over the semiconductor substrate 320. The interconnect layer 330 is formed from the electrode pad 324 to reach the area over the resin layer 328, and includes the electrical connection section (e.g. land) 332 formed over the resin layer 328. The interconnect layer 330 may be formed by stacking one or more layers of copper (Cu), chromium (Cr), titanium (Ti), nickel (Ni), titanium tungsten (TiW), gold (Au), aluminum (Al), nickel vanadium (NiV), and tungsten (W). The electrical connection sections 332 may be arranged on the resin layer 328 in rows and columns.

A resin layer 334 is formed over the semiconductor substrate 320 so that the resin layer 334 covers a part of the interconnect layer 330. The resin layer 334 is formed to avoid (at least the center of) the electrical connection section 332 of the interconnect layer 330. The resin layer 334 may be a solder resist.

As shown in FIG. 11, after forming an external terminal 360 on the electrical connection section 332 of the semiconductor substrate 320, a resin layer 336 may be formed in the area excluding the top of the external terminal 360 in order to reinforce the base of the external terminal 360.

The third embodiment may also be applied to the modification of the first embodiment. Specifically, the paste application step and the washing step may be carried out for only the electrical connection sections 332 located at positions at which stress tends to be applied to the electrical connection sections 332.

Fourth Embodiment

Figure 12:
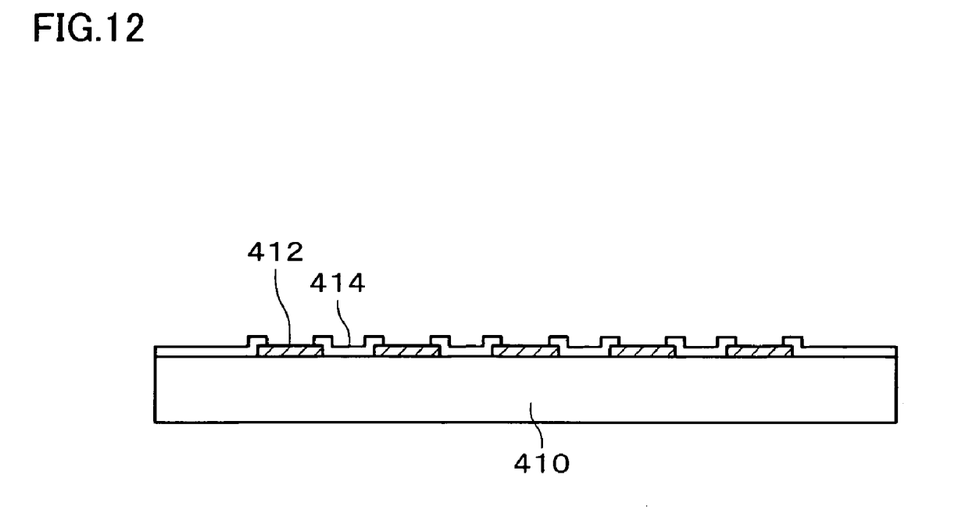
FIG. 12 is illustrative of a fourth embodiment of the invention.
Figure 13:
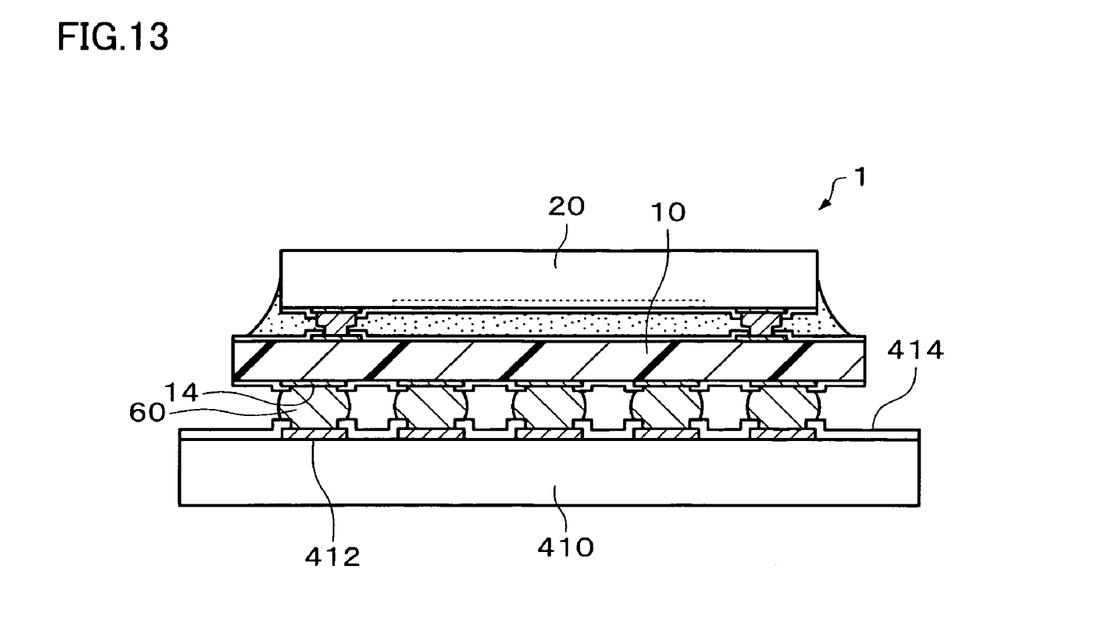
FIG. 13 is illustrative of the fourth embodiment of the invention.

FIGS. 12 and 13 are diagrams showing a method of treating an electrical connection section according to a fourth embodiment of the invention.

In the fourth embodiment, the paste application step and the washing step described in the first embodiment are carried out for an electrical connection section 412 (e.g. land) formed on a motherboard 410. A protective film 414 (e.g. solder resist) is formed on the motherboard 410 so that the protective film 414 avoids the electrical connection sections 412.

The motherboard 410 is a substrate on which an electronic part is mounted. As examples of the motherboard 410, a rigid substrate, a flexible substrate, a flexible rigid substrate, a built-up substrate, and the like can be given. As examples of the electronic parts, a semiconductor device, optical element, resistor, capacitor, coil, oscillator, filter, thermosensor, thermistor, varistor, variable resistor, volume, fuse, and the like can be given. For example, after performing the paste application step and the washing step, the semiconductor device 1 as the electronic part may be bonded with solder (soldered) to the electrical connection sections 412 of the motherboard 410 (see FIG. 13).

Fifth Embodiment

Figure 14:
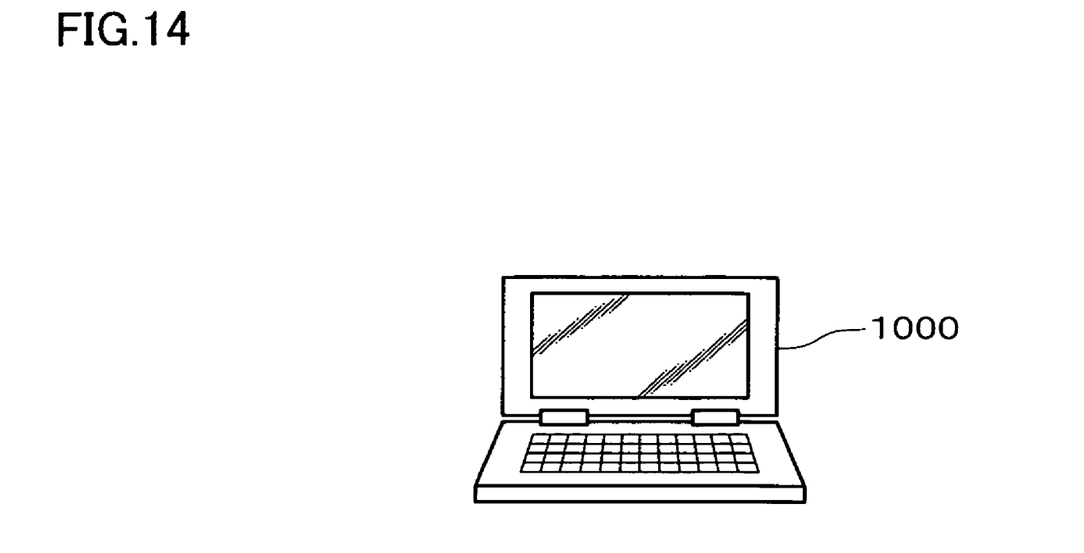
FIG. 14 is illustrative of a fifth embodiment of the invention.
Figure 15:
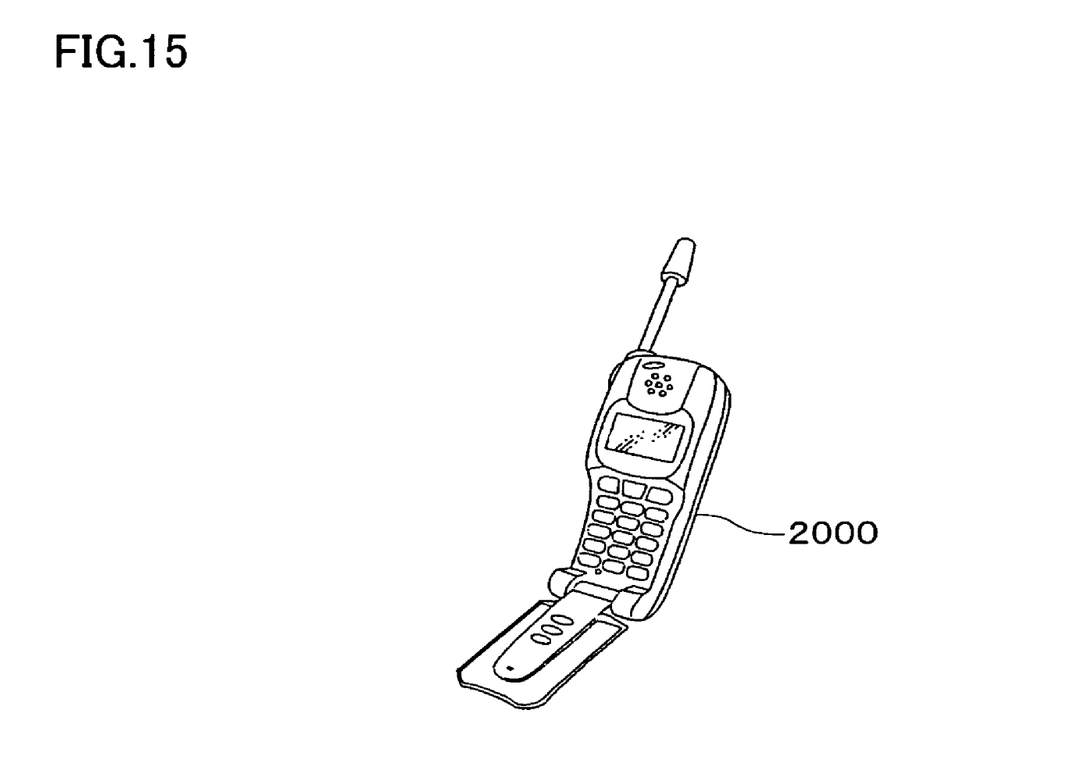
FIG. 15 is illustrative of the fifth embodiment of the invention.

FIGS. 14 and 15 respectively illustrate a notebook type personal computer 1000 and a portable telephone 2000 as electronic instruments according to a fifth embodiment of the invention. The electronic instrument according to the fifth embodiment includes a semiconductor device manufactured according to one of the above-described embodiments.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A method of manufacturing a semiconductor device, comprising:
    providing an electrical connection section and a protective film, the electrical connection section being electrically connected with a semiconductor substrate, a first part of the protective film covering at least a first area of a first surface of the electrical connection section, the first part of the protective film having a first face facing the first area of the first surface of the electrical connection section and a second face opposite to the first face, the protective film having an opening disposed on a second area of the first surface of the electrical connection section;
    applying a paste containing acid on the second area of the first surface of the electrical connection section and the second face of the first part of the protective film after providing of the electrical connection section and the protective film;
    removing the paste from the second area of the first surface of the electrical connection section by washing the electrical connection section;
    providing a solder to the electrical connection section through a flux after the removing of the paste; and
    providing the solder in such a manner that the solder is in touch with the second area of the first surface of the electrical connection section after the providing of the solder to the electrical connection section.

2. The method of manufacturing a semiconductor device as defined in claim 1, wherein the paste applied in the applying of the paste includes a material that is the same as a material for the flux provided in the providing of the solder to the electrical connection section.

3. The method of manufacturing a semiconductor device as defined in claim 1, wherein the paste applied in the applying of the paste includes a material containing an acid at a ratio higher than that of a material for the flux provided in the providing of the solder to the electrical connection section.

4. The method of manufacturing a semiconductor device as defined in claim 1, wherein the paste applied in the applying of the paste includes a material containing an acid having a higher reducing power than that of an acid contained in the flux provided in the providing of the solder to the electrical connection section.

5. The method of manufacturing a semiconductor device as defined in claim 1, wherein the applying of the paste and the removing of the paste are performed in air or in an oxygen atmosphere.

6. The method of manufacturing a semiconductor device as defined in claim 1, wherein the acid contained in the paste is an organic acid.

7. The method of manufacturing a semiconductor device as defined in claim 1, wherein the acid contained in the paste is an inorganic acid.

8. The method of manufacturing a semiconductor device as defined in claim 1,
   wherein the semiconductor substrate is mounted on an interposer; and
   wherein the electrical connection section is a land formed on the interposer.

9. The method of manufacturing a semiconductor device as defined in claim 1, wherein the electrical connection section is an electrode pad formed on the semiconductor substrate.

10. The method of manufacturing a semiconductor device as defined in claim 1,
    wherein a resin layer is formed on the semiconductor substrate; and
    wherein the electrical connection section is a land formed on the resin layer.

11. The method of manufacturing a semiconductor device as defined in claim 1,
    wherein multiple electrical connection sections are arranged in rows and columns; and
    wherein the applying of the paste and the removing of the paste are carried out for the electrical connection sections positioned on an outer end of the rows and columns.

12. The method of manufacturing a semiconductor device as defined in claim 11, wherein the applying of the paste and the removing of the paste are carried out for the electrical connection sections positioned at outer corners of the rows and columns.

13. The method of manufacturing a semiconductor device as defined in claim 11,
    wherein the electrical connection sections are arranged in rows and columns in an area enclosing a specific area; and
    wherein the applying of the paste and the removing of the paste are carried out for the electrical connection sections positioned on an inner end of the rows and columns closest to the specific area.

* * * * *